United States Patent
Kang et al.

(10) Patent No.: US 9,793,355 B2
(45) Date of Patent: Oct. 17, 2017

(54) EPITAXIAL WAFER AND SWITCH ELEMENT AND LIGHT-EMITTING ELEMENT USING SAME

(71) Applicant: LG INNOTEK CO., LTD., Seoul (KR)

(72) Inventors: Seok Min Kang, Seoul (KR); Ji Hye Kim, Seoul (KR); Min Young Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/648,704

(22) PCT Filed: Nov. 21, 2013

(86) PCT No.: PCT/KR2013/010645
§ 371 (c)(1),
(2) Date: May 30, 2015

(87) PCT Pub. No.: WO2014/084549
PCT Pub. Date: Jun. 5, 2014

(65) Prior Publication Data
US 2015/0311290 A1  Oct. 29, 2015

(30) Foreign Application Priority Data

Nov. 30, 2012 (KR) .................. 10-2012-0137985
Feb. 5, 2013 (KR) .................. 10-2013-0012962

(51) Int. Cl.
*H01L 29/16* (2006.01)
*H01L 29/36* (2006.01)
(Continued)

(52) U.S. Cl.
CPC .... *H01L 29/1608* (2013.01); *H01L 21/02378* (2013.01); *H01L 21/02521* (2013.01);
(Continued)

(58) Field of Classification Search
None
See application file for complete search history.

(56) References Cited

U.S. PATENT DOCUMENTS

2004/0237879 A1* 12/2004 Kaneko .................. C30B 19/04
117/2
2005/0118746 A1 6/2005 Sumakeris et al.
(Continued)

FOREIGN PATENT DOCUMENTS

| CN | 202009004 U | * 10/2012 | .......... H01L 29/872 |
| JP | 2000-319099 A | 11/2000 | |
| JP | 2005-079232 A | 3/2005 | |

OTHER PUBLICATIONS

Chinese full document of Cui et al (CN-202009004-U) otherwise unavailable.*
Search Report for International Application No. PCT/KR2013/010645.
SIPO Office Action for Chinese Application No. 201380070392.2.

*Primary Examiner* — Johannes P Mondt
(74) *Attorney, Agent, or Firm* — LRK Patent Law Firm (57) ABSTRACT

An epitaxial wafer comprises an epitaxial layer disposed on a substrate. The epitaxial layer comprises first to third semiconductor layers. The third semiconductor layer has a thickness that is thicker than that of the first semiconductor layer. A second doping density of the second semiconductor layer is between a first doping density of the first semiconductor layer and a third doping density of the third semiconductor layer.

13 Claims, 6 Drawing Sheets

(51) Int. Cl.
  *H01L 29/872* (2006.01)
  *H01L 33/22* (2010.01)
  *H01L 33/26* (2010.01)
  *H01L 33/34* (2010.01)
  *H01L 21/02* (2006.01)
  *H01L 33/02* (2010.01)
  *H01L 29/24* (2006.01)
  *H01L 29/34* (2006.01)
  *H01L 33/00* (2010.01)

(52) U.S. Cl.
  CPC ........ *H01L 21/02529* (2013.01); *H01L 29/24* (2013.01); *H01L 29/34* (2013.01); *H01L 29/36* (2013.01); *H01L 29/872* (2013.01); *H01L 33/0033* (2013.01); *H01L 33/025* (2013.01); *H01L 33/22* (2013.01); *H01L 33/26* (2013.01); *H01L 33/34* (2013.01)

(56) References Cited

U.S. PATENT DOCUMENTS

| | | | |
|---|---|---|---|
| 2007/0015308 A1* | 1/2007 | Shenoy | H01L 21/0495 438/92 |
| 2007/0292999 A1 | 12/2007 | Henning et al. | |
| 2008/0258183 A1* | 10/2008 | Rupp | H01L 21/0485 257/256 |
| 2010/0032791 A1* | 2/2010 | Hozumi | H01L 29/0615 257/493 |
| 2010/0119849 A1* | 5/2010 | Nakamura | C30B 25/20 428/446 |
| 2010/0193799 A1* | 8/2010 | Nakano | H01L 29/1608 257/77 |
| 2012/0049902 A1 | 3/2012 | Corona et al. | |
| 2012/0049940 A1* | 3/2012 | Frisina | H01L 21/046 327/539 |

* cited by examiner

EPITAXIAL WAFER AND SWITCH ELEMENT AND LIGHT-EMITTING ELEMENT USING SAME

TECHNICAL FIELD

The embodiment relates to an epitaxial wafer.

The embodiment relates to a method of fabricating an epitaxial wafer.

The embodiment relates to a power element using an epitaxial wafer.

The embodiment relates to a light-emitting element using an epitaxial

BACKGROUND ART

Electronic elements have been extensively used in the society at large.

Although conventional electronic elements are fabricated using sapphire or silicon, the sapphire or the silicon does not satisfy the requirements of the electronic elements.

Recently, researches and studies have been actively performed on electronic elements based on silicon carbide.

However, the quality of wafers, which serves as a substrate including silicon carbide, is not satisfactory.

DISCLOSURE

Technical Problem

The embodiment provides an epitaxial wafer having excellent quality.

The embodiment provides an epitaxial wafer capable of minimizing defects.

The embodiment provides a power element using the epitaxial wafer.

The embodiment provides a light-emitting element using the epitaxial wafer.

Technical Solution

According to the embodiment, there is provided an epitaxial wafer including a substrate, and an epitaxial layer on the substrate. The epitaxial layer includes a first semiconductor layer disposed on the substrate and having a first doping concentration, a second semiconductor layer disposed on the first semiconductor layer and having a second doping concentration, and a third semiconductor layer disposed on the second semiconductor layer, having a thickness thicker than a thickness of the first semiconductor layer, and having a third doping concentration, and the second doping concentration is between the first doping concentration and the third doping concentration.

According to the embodiment, there is provided a switch element including a substrate, a first semiconductor layer on the substrate, a second semiconductor layer on the first semiconductor layer, a third semiconductor layer on the second semiconductor layer, an anode electrode on the third semiconductor layer, and a cathode electrode under the substrate. The third semiconductor layer has a thickness thicker than a thickness of the first semiconductor layer, and a second doping concentration of the second semiconductor layer is between a first doping concentration of the first semiconductor layer and a third doping concentration of the third semiconductor layer.

According to the embodiment, there is provided a switch element including a substrate, a first semiconductor layer on the substrate, a second semiconductor layer on the first semiconductor layer, a third semiconductor layer on the second semiconductor layer, a source contact, a drain contact, and a gate contact on the third semiconductor layer, and a gate insulator between the third semiconductor layer and the gate contact. The third semiconductor layer has a thickness thicker than a thickness of the first semiconductor layer, and a second doping concentration of the second semiconductor layer is between a first doping concentration of the first semiconductor layer and a third doping concentration of the third semiconductor layer.

According to the embodiment, there is provided a light emitting element including a substrate, an epitaxial layer on the substrate, and a light emitting structure disposed on the epitaxial layer and including at least a first conductive semiconductor layer, an active layer, and a second conductive semiconductor layer. The epitaxial layer includes a first semiconductor layer on the substrate, a second semiconductor layer on the first semiconductor layer, and a third semiconductor layer on the second semiconductor layer. The third semiconductor layer has a thickness thicker than a thickness of the first semiconductor layer, and a second doping concentration of the second semiconductor layer is between a first doping concentration of the first semiconductor layer and a third doping concentration of the third semiconductor layer.

Advantageous Effects

As described above, according to the embodiment, the internal defects and surface defects of the epitaxial layer can be minimized by reducing the flux of the reaction source to initially grow the epitaxial material at a low speed.

According to the embodiment, the internal defects and the surface defects of the epitaxial layer can be minimized by reducing the flux of Si to initially grow the epitaxial material at a low speed According to the embodiment, the internal defects and the surface defects of the epitaxial layer can be minimized by reducing the flux of the growth source and the flux of the doping source to initially grow the epitaxial material at the low speed.

Accordingly, the epitaxial wafer having minimized internal defects and surface defects is applied to the electronic element, so that the characteristic required for the relevant electronic element can be satisfied.

According to the embodiment, even if the growth condition is changed, the growth is continued so that the semiconductor layer growth is not stopped between the first and third semiconductor layers. Therefore, defects can be more reduced, and the efficiency in the growth process can be enhanced, so that the process time can be reduced.

BEST MODE

Mode for Invention

In the description of the embodiments, it will be understood that, when a layer (or film), a region, a pattern, or a structure is referred to, as being "on" or "under" another substrate, another layer (or film), another region, another pad, or another pattern, it can be "directly" or "indirectly" on the other substrate, layer (or film), region, pad, or pattern. Such a position of the layer has been described with reference to the drawings.

Hereinafter, embodiments will be described with reference to accompanying drawings. Thicknesses and sizes of each layer in the drawings are exaggerated, omitted, or simplified for convenience and clarity of description. In addition, sizes of each component do not completely reflect the actual size.

A semiconductor-based electronic element may be formed by forming an additional structure on an epitaxial wafer. Accordingly, in order to fabricate a semiconductor-based electronic element having superior quality, the quality of the epitaxial wafer can be ensured.

The quality of the epitaxial wafer according to the embodiment can be ensured by minimizing surface roughness and surface defects as a growth process condition is optimized.

The surface defects of the epitaxial wafer may be generated due to internal defects such as a Basal Plane Dislocation (BPD), Stacking Faults (SFs), and a Frank Partial Dislocation (FPD) occurring in the epitaxial growth process.

The surface roughness and the surface defect of the epitaxial wafer may be varied depending on process conditions such as a flux of a reaction source introduced in the initial stage, a growth temperature, pressure, a whole flux of the reaction source, a C/Si ratio, a Si/H2 ratio. Accordingly, the surface defect density and the surface roughness can be minimized by optimizing the process conditions.

For example, the surface roughness of the epitaxial wafer according to the embodiment may be 1 nm or less. In addition, the surface defect density of the epitaxial wafer according to the embodiment may be 0.1/cm2 or less. Accordingly, the quality of the semiconductor-based electronic element can be improved by using the epitaxial wafer.

The electronic element according to the embodiment may include a switch element fort switching control and a light-emitting element to emit light. The switch element may include power elements such as a Schottky barrier diode and a metal semiconductor field effect transistor (MESFET), but the embodiment is not limited thereto.

Figure 1:
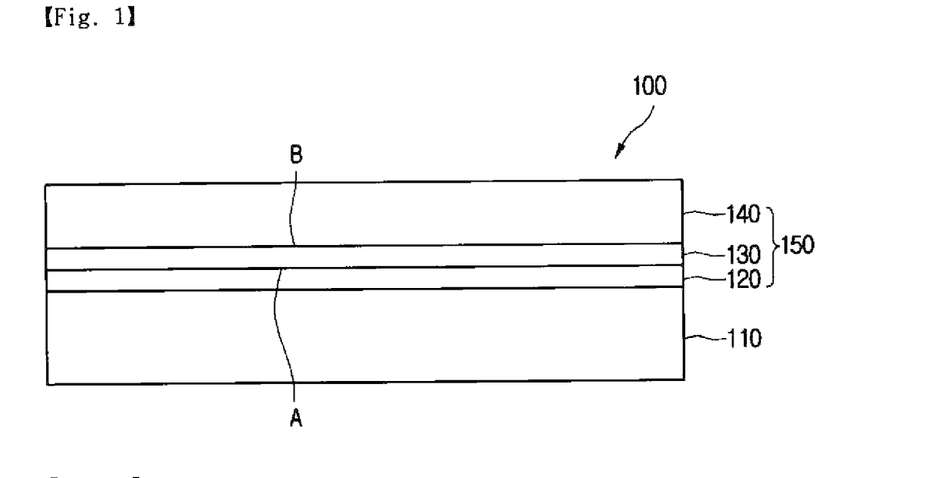
FIG. 1 shows a sectional view showing an epitaxial wafer according to the embodiment.

FIG. 1 shows a sectional view showing an epitaxial wafer according to the embodiment.

Referring to FIG. 1, an epitaxial wafer 100 according to the embodiment may include a substrate 110 and an epitaxial layer 150.

The substrate 110 may include silicon carbide. In other words, the substrate 110 may include one of 3C—SiC, 4H—SiC and 6H—SiC.

The substrate 110 may include silicon carbide. In other words, the substrate 110 may include any one of 3C—SiC, 4H—SiC and 6H—SiC.

Silicon carbide may be a compound semiconductor including silicon (Si) and carbon (C). As compared with typical silicon (Si), silicon carbide has 10 times greater than the dielectric breakdown field strength, 3 times greater than the bandgap and 3 times greater than the thermal conductivity.

Due to the excellent characteristics, silicon carbide is expected to be widely utilized in electronic elements. Silicon carbide may be employed in power elements or light-emitting elements. Specifically, the power elements based on silicon carbide may withstand high breakdown voltages, have low resistivity and be operated in high temperatures.

Due to the high breakdown voltage, a very thin drift layer is formed so the thickness of the power element, may be significantly reduced.

An epitaxial material may be grown on the substrate 110 to form the epitaxial layer 150.

The epitaxial layer 150 may be grown by using HVPE (Hydride Vapor Phase Epitaxy), MOCVD (Metal Organic Chemical Vapor Deposition), MBE (Molecular Beam Epitaxy) or sputtering.

The epitaxial material may include a compound semiconductor that is same as the substrate 110, for example silicon carbide, but the embodiment is not limited thereto.

Since the epitaxial layer 150 includes the same material, as the substrate 110, a lattice constant difference or a thermal expansivity difference between the epitaxial layer 120 and the substrate 110 is not made or the difference is slight. Accordingly, the probability of defects, such as bending, due to stress is not greatly represented.

In addition, since the epitaxial layer 150 is grown using a material that is same as the material of the substrate 110, the crystalline of the epitaxial layer 150 may be improved.

The epitaxial layer 150 according to the embodiment may include a first semiconductor layer 120, a second semiconductor layer 130, and a third semiconductor layer 140. The second semiconductor layer 130 may be provided on the first semiconductor layer 120, and the third semiconductor layer 140 may be provided on the second semiconductor layer 130. Although the first to third semiconductor layers 120 to 140 include the same compound semiconductor material, for example, silicon carbide, the embodiment is not limited thereto. The third semiconductor layer 140 may be an active layer for performing specific functions of the electronic element, but the embodiment is not limited thereto. For example, the second semiconductor layer 140 may be a drift layer of the power element or a conductive semiconductor layer of the light emitting element.

The first semiconductor layer 20 may be a buffer layer to lessen or minimize the defects that occurs in the third semiconductor layer 140. The defects may be an internal defect that occurs in the first to third semiconductor layers 120, 130 and 140 or a surface defect that occurs on a top surface of the third semiconductor layer 140.

The surface defects include droplets, triangle defects, pits, wavy pits, particles, etc.

Since the third semiconductor layer 140 is grown on the first semiconductor layer 120, the defect occurring in the first semiconductor layer 120 must be minimized in order to minimize the defects occurring gin the third semiconductor layer 140. The first semiconductor layer 120 may serve as a seed layer to grow the third semiconductor layer 140. If the defects occur in the first semiconductor layer 120, the defects occurring in the first semiconductor layer 120 may be spread to the third semiconductor layer 140 through the second semiconductor layer 130.

In order to minimize the defects occurring in the first semiconductor layer, the first and third semiconductor layers 120 and 140 may be growth under mutually different process conditions. For example, the first process condition may be set so that the growth speed of the first semiconductor layer 120 is reduced while the defects are minimized, and the second process condition may be set so that the growth speed of the third semiconductor layer 140 is increased.

Through the above process, the epitaxial layer 150 according to the embodiment, that is, the third semiconductor layer 140 may have the surface roughness of 1 nm or less, and the surface defect density of 0.1/cm2 or less.

According to the embodiment, the size of a target for defect determination may be in the range of several µm to several µm. Accordingly, the target having the size beyond the range is excluded from the defect determination.

The epitaxial layer 150 may be named "epitaxial structure", "epitaxial film", or "a semiconductor structure".

Meanwhile, the second semiconductor layer 130 prevents a phenomenon in which growth is discretely performed and not continuously performed from the first semiconductor layer 120 to the third semiconductor layer 140 due to the difference in growth condition among the first to third semiconductor layers 120 to 140. To this end, the growth condition of the second semiconductor layer 130 may be varied between the growth conditions of the first semiconductor layer 120 and the third semiconductor layer 140. In other words, the growth condition of the second semiconductor layer 130 may be varied from the growth condition of the first semiconductor layer 120 to the third semiconductor layer 140. For example, the growth temperature for the growth of the second semiconductor layer may be decreased from the growth temperature for the growth of the first semiconductor layer 120 to the growth temperature for the growth of the third semiconductor layer 140. For example, a flux or a reaction source or a growth source for the growth of the second semiconductor layer 130 may be increased from a flux or a reaction source or a growth source for the growth of the first semiconductor layer 120 to a flux or a reaction source or a growth source for the growth of the third semiconductor layer 140.

As the growth of the first semiconductor layer 120 and the growth of the third semiconductor layer 140 are continuously achieved as described above, the internal defect can be more reduced, so that not only can the surface defect density be reduced, but also the surface roughness of the third semiconductor layer 140 can be more reduced. The second semiconductor layer 130 may be formed due to the continuous growth of the first and third semiconductor layers 120 and 140.

The doping concentrations of the first to third semiconductor layers 120, 130, and 140 may be different from each other. For example, the doping concentration of the first semiconductor layer 120 may be greater than that of the third semiconductor layer 140. For example, the doping concentration of the second semiconductor layer 130 may have an intermediate value between the doping concentrations of the first and third semiconductor layers 120 and 140, and may be reduced linearly or non-linearly so that the doping concentration of the second semiconductor layer 130 may be equal to or approximate the doping concentration of the first semiconductor layer 120 to be equal to approximate the doping concentration of the third semiconductor layer 140, but the embodiment is not limited thereto. Accordingly, the doping concentration of the second semiconductor layer 130 at a boundary surface A making contact with the first semiconductor layer 120 may be different from that of the second semiconductor layer 130 at a boundary surface B making contact with the third semiconductor layer 140.

The defects that may be caused due to the lattice mismatch from the substrate 110 may be prevented by increasing the doping concentration of the first semiconductor layer 120. According to the embodiment, since a buffer layer function of the first semiconductor layer 120 is more enhanced by the second semiconductor layer 130 that may serve as a buffer layer, the internal defects can be minimized by the first and second semiconductor layers 120 and 130.

Since the internal defect can be minimized by the first and second semiconductor layers 120 and 130 as described above, the surface defect as well as the internal defect can be minimized in the third semiconductor layer 140. Further, even the surface roughness of the third semiconductor layer 140 can be remarkably reduced to improve the crystalline of another semiconductor layer formed on the third semiconductor layer 140, so that the electrical/optical characteristics can be improved. Accordingly, the product reliability of the electronic element mounted on the epitaxial wafer can be improved.

Hereinafter, the fabrication process of the epitaxial wafer according to the embodiment will be described.

Hereinafter, a scheme of reducing the surface roughness to 1 nm or less and the surface defect density to $0.1/cm^2$ or less will be described according to the first and second embodiments.

Figure 2:
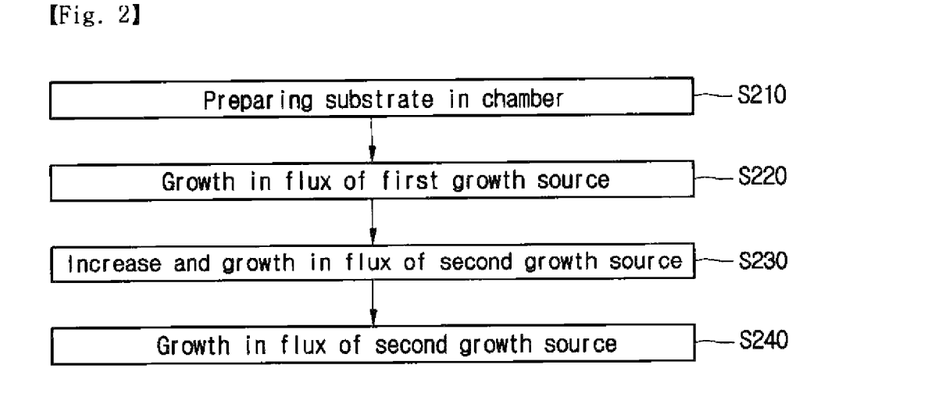
FIG. 2 is a flowchart showing the fabricating process of an epitaxial wafer of FIG. 1 according to a first embodiment.
Figure 3:
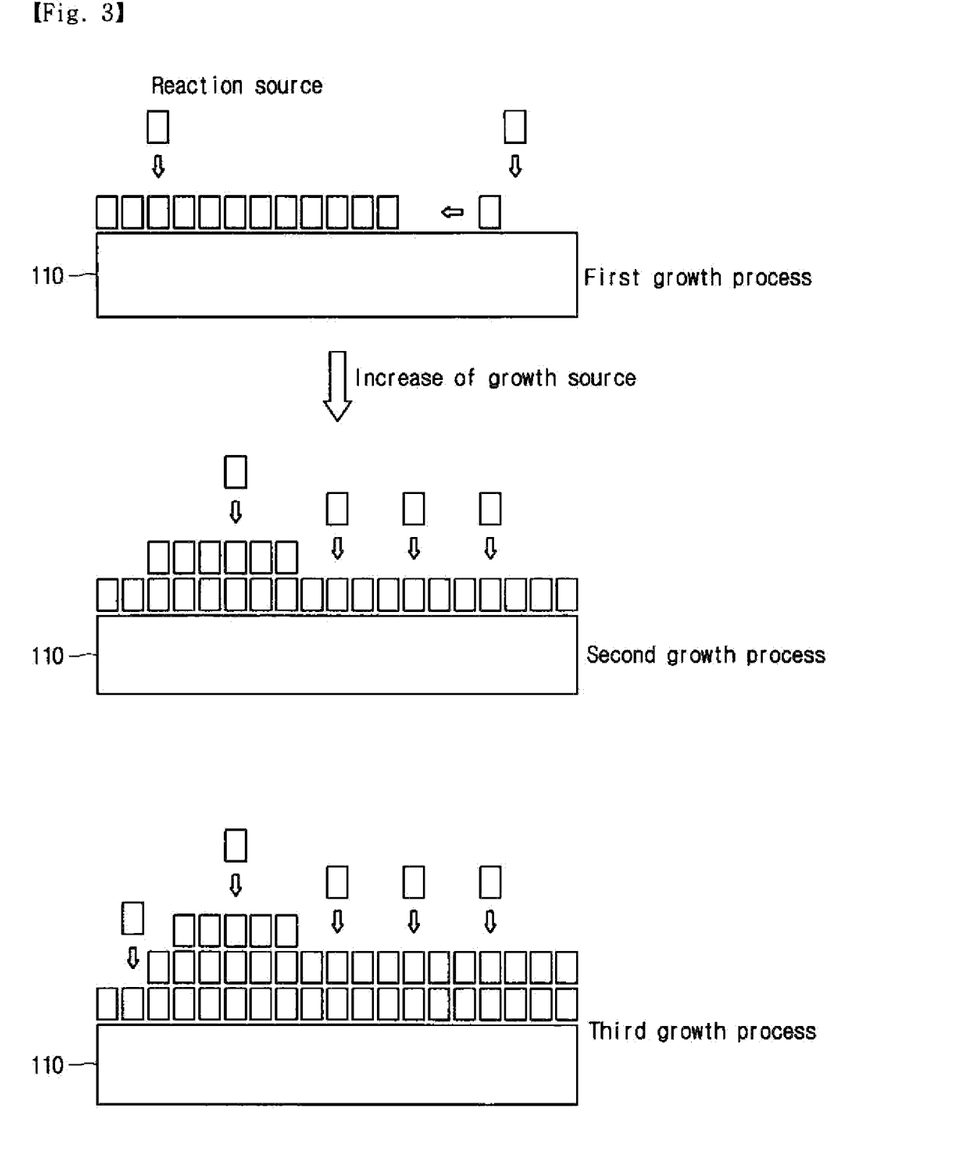
FIG. 3 shows the fabricating process of FIG. 2.

FIG. 2 is a flowchart showing the fabricating process of an epitaxial wafer of FIG. 1 according to a first embodiment. FIG. 3 shows the fabricating process of FIG. 2.

Referring to FIGS. 2 and 3, the substrate 110 may be provided in a reaction chamber (S210).

Although the substrate 110 may include one of 3C—SiC, 4H—SiC and 6H—SiC for the illustrative purpose, the material constituting the substrate 110 may be varied depending on an element or a product to be produced in the final stage.

The substrate 110 may be undoped or may be doped with an N type dopant or a P type dopant, but the embodiment is not limited thereto.

Before the substrate 110 is loaded into the reaction chamber, a cleaning process may be performed in order to remove an oxide layer naturally created on the surface of the substrate 110.

The substrate 110 may, for example have an off angle of about 0° to 10°, but the embodiment is not limited thereto. The off angle may be defined as an inclined angle of the substrate 110 based on a (0001)Si surface and a (000-1)C surface.

When the substrate 110 is provided, the reaction source for the epitaxial growth may be introduced into the reaction chamber.

The reaction source may include a growth source for epitaxial growth, a doping source for doping and dilution gas, but the embodiment is not limited thereto.

The growth source may be varied depending on the material and the type of the substrate 110. For example, when the substrate 110 includes silicon carbide, solid, liquefied or gasified material, such as $SiH_4+C_3H_8+H_2$, MTS ($CH_3SiCl_3$), TCS($SiHCl_3$), or $Si_xC_x$, including carbon and silicon, and having a lattice constant equal to or approximate to that of the substrate 110 may serve as the growth source.

The doping source may include a group V compound semiconductor material including a nitrogen gas ($N_2$) for N type doping, or a group III compound semiconductor material including Al for P type doping.

For example, a P type aluminum silicon carbide (AlSiC) semiconductor layer may be grown through the growth process employing the growth source including silicon carbide, the doping source including Al, and the dilution gas.

For example, an N type silicon carbide nitride (SiCN) semiconductor layer may be grown through the growth process employing the growth source including silicon carbide, the doping source including nitrogen gas ($N_2$) and the dilution gas.

The P type aluminum silicon carbide (AlSiC) semiconductor layer or the N type silicon carbide nitride (SiCN) semiconductor layer may be a conductive semiconductor layer, but the embodiment is not limited thereto.

The dilution gas may dilute the growth source or the doping source. The dilution gas may include inert gas, such as hydrogen gas ($H_2$), argon gas (Ar), or helium gas (Hg), but the embodiment is not limited thereto.

The first semiconductor layer 120 may be grown on the substrate 110 through a first growth process. In other words, according to the first growth process, an epitaxial material is grown in a flux of a first growth source to form the first semiconductor layer 120 (S220).

The flux of the first growth source may be related to the ratio of the growth source to the dilution gas. The ratio of the growth source to the dilution gas in the first growth process may be maintained in the range of about 1:4000 to 1:3000, but the embodiment is not limited thereto. The growth source related to the ratio of the growth source to the dilution gas may include a silicon-based material.

Further, in the first growth process, a C/Si ratio may be in the range of 0.5 to 1.0, and the introduction parameter of the reaction source may be adjusted to a value in the range of 10 ml/min to 25 ml/min.

The introduction parameter of the reaction source may be defined as expressed in following equation 1.

[Equation 1]
$$\text{Introduction parameter} = \frac{(a1*\text{flux of growth source}+b1)}{((a2*\text{flux of doping source})+b2)*\left(\begin{array}{l}(a3*\text{flux of doping source})+\\(a4*\text{flux of dilution gas})+b3\end{array}\right)}$$

In Equation 1, a1 to a4 represent positive real numbers, b1 to b3 represent real numbers, the flux of the growth source, the flux of the doping source, and the flux of the dilution gas have a unit of ml/min. For example, a1=a2==a3=a4=1, and b1=b2=b3=0.

In this case, the growth source, the doping source, and the dilution gas may be introduced to an extent that the introduction parameter of Equation 1 satisfies the range of about ¹/25 min/ml to about ¹/10 min/ml, that is, about 10 ml/min to about 25 ml/min.

Through the first growth process, the first semiconductor layer 120 may be formed with the doping concentration in the range of about $5\times10^{17}/cm^3$ to about $5\times10^{18}/cm^3$.

In the first growth process, the first growth source may be introduced in less flux, so that the first semiconductor layer 120 can be grown at a low speed. Accordingly, the mobility between atoms of an epitaxial material, that is, the reaction source can be increased, so that atoms can be uniformly distributed. Therefore, the crystalline can be improved, and the internal defect can be reduced. The reduction in the internal defect of the first semiconductor layer 120 decreases the internal defect and the surface defect of the third semiconductor layer 140 while reducing the surface roughness.

The thickness of the first semiconductor layer 120 grown through the first growth process may be in the range of about 0.5 μm to 1 μm. When the first semiconductor layer 120 having a thickness of 0.5 μm or less is applied to a power element thereafter, withstanding voltage is reduced, so that the first semiconductor layer 120 may not be utilized as the power element. If the thickness of the first semiconductor is 1 μm or more, leaking current may be increased.

The second growth process may be performed subsequently to the first growth process to form the second semiconductor layer 130. In other words, the reaction gas is introduced in the second growth process while the flux of the first growth source is increased the flux of the second growth source to perform the epitaxial growth, so that the second semiconductor layer 130 may be formed (S230). As described above, the epitaxial growth is continuously performed by continuously introducing the second growth source, so that the second semiconductor layer 130 may be formed subsequently to the first semiconductor layer 120.

In the second growth process, the C/Si ratio may be about 1.0. The introduction parameter of the reaction gas may be in the range of about 15 ml/min to 0.5 ml/min.

The flux of the second growth source, that is, the ratio of the growth source to the dilution gas may be increased to 1:800 from a ratio in the range of about 1:4000 to about 1:3000. The flux of the growth source in the second growth process may be increased linearly, non-linearly, or step by step.

Figure 4:
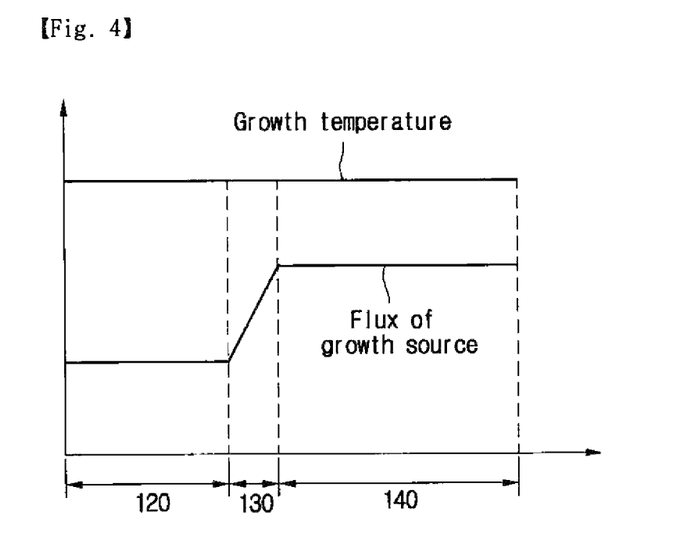
FIG. 4 is a graph showing a flux of a growth source and the variation of a growth temperature according to epitaxial growth.

As shown in FIG. 4, the flux of the growth source in the second growth process may be increased to the flux of the second growth source in the third growth process from the flux of the first growth source in the first growth process.

The second growth process may be an intermediate process to set the third growth process, that is, a step that the flux of the growth source is varied.

According to the first embodiment, the epitaxial growth is not stopped, but may be continuously performed in the second growth process, so that not only can the third semiconductor layer 140 be easily grown, but also the internal defect and the surface defect can be reduced and the surface roughness can be lowered.

The difference in doping concentration between the first semiconductor layer 120 and the third semiconductor layer 140 can be adjusted by the second semiconductor layer 130. Accordingly, as shown in FIG. 1, the doping concentration at the boundary surface A of the second semiconductor layer 130 making contact with the first semiconductor layer 120 may be different from the doping concentration at the boundary surface B of the second semiconductor layer 130 making contact with the third semiconductor layer 140. In order to obtain the doping concentration of the second semiconductor layer 130, the flux of the doping source in the second growth process may be reduced from the flux of the doping source in the first growth process to the flux of the doping source in the second growth process. As the second semiconductor layer 130 is grown by reducing the flux of the doping source as described above, the difference in doping concentration of the second semiconductor layer 130 between the boundary surfaces A and B may be made. Accordingly, the doping concentration of the second semiconductor layer 130 may be reduced from the doping concentration of $5 \times 10^{16}/cm^3$ to $1 \times 10^{16}/cm^3$ to the doping concentration of $1 \times 10^{16}/cm^3$ to $5 \times 10^{14}/cm^3$.

The second semiconductor layer 130 may be grown until the second semiconductor layer 130 satisfies the flux of the growth source and the flux of the doping source required in the third growth process. The thickness of the grown second semiconductor layer 130 may be equal to the thickness of the first semiconductor layer 120, but the embodiment is not limited thereto. If the second semiconductor layer 130 satisfies the flux of the growth source and the flux of the doping source required in the third growth process at an earlier time point, the thickness of the second semiconductor layer 130 may be thinner than that of the first semiconductor layer 120.

According to the first embodiment, the second semiconductor layer 130 is formed between the first and third semiconductor layers 120 and 140 by changing the flux of the doping source and the flux of the growth source, so that semiconductor layer growth can be continued from the first semiconductor layer 120 to the third semiconductor layer 140 and not stopped. In addition, since the first and third semiconductor layers 120 and 140 are different from each other in the flux of the doping source and the flux of the growth source, when the third semiconductor layer 140 is grown immediately after the first semiconductor layer 120 has been grown, the introduction of the reaction source must be stopped in order to adjust the flux of the growth source. However, according to the first embodiment, the growth can be continued and not stopped during the change in the flux of the doping source and the flux of the growth source.

According to the first embodiment, the second semiconductor layer 130 in which the doping concentration is changed is formed, so that the defect, which may occur in the first semiconductor layer 120, can be prevented from being propagated to the third semiconductor layer 140.

In addition, the second semiconductor layer 130 serves as a buffer layer together with the first semiconductor layer 120 to prevent the defects caused by the lattice mismatch from the substrate 110. In addition, due to both of the first and second semiconductor layers 120 and 130, the defect caused by the third semiconductor layer 140 can be minimized, and the surface roughness of the third semiconductor layer 140 can be minimized.

The third growth process is performed subsequently to the second growth process, so that the third semiconductor layer 140 may be formed. In other words, the epitaxial growth is performed until the target thickness is obtained using the flux of second growth source, thereby forming the third semiconductor layer (S240). The flux of the growth source, that is, the ratio of the growth source to the dilution gas may be in the range of about 1:800.

The C/Si ratio may be in the range of about 0.9 to 1.0, and the introduction parameter of the reaction gas may be in the range of 5 mV/min to 0.5 ml/min in the third growth process.

Since the flux of the second growth source required in the third growth process is increased through the second growth process, the epitaxial growth can be performed using the flux of the second growth source until the target thickness of the third semiconductor layer 140 can be obtained.

The doping concentration of the third semiconductor layer 140 may be set lower than that of the first semiconductor layer 120 or the second semiconductor layer 130, but the embodiment is not limited thereto. For example, the doping concentration of the third semiconductor layer 140 may be in the range of $2 \times 10^{15}/cm_3$ to $7 \times 10^{15}/cm^3$.

As shown in FIG. 4, the flux of the second growth source in the third growth process may be greater than the flux of the first growth source in the first growth process.

The flux of the growth source may be proportional to the growth speed. Accordingly, as the flux of the second growth source is increased, the growth speed of the third semiconductor layer 140 may be increased.

For example, when the growth is performed in the flux of the first growth source through the first growth process, the growth speed of the first semiconductor layer 120 may be in the range of about 1 μm/h to 3 μm/h. Meanwhile, when the growth is performed in the flux of second growth source through the third growth process, the growth speed of the third semiconductor layer 140 may be about 20 ml/min or more.

The third semiconductor layer 140 is a layer to improve the growth speed, and may have the thickness thicker than that of the first semiconductor layer 120, but the embodiment is not limited thereto. In addition, the third semiconductor layer 140 may serve as an active layer to perform the first conductive semiconductor layer of the light-emitting element, but the embodiment is not limited thereto.

Meanwhile, since the flux of the growth source in the second growth process is increased from the flux of first growth source in the first growth process to the flux of second growth source in the second growth process, the growth speed in the second growth process may be changed, in detail, increased from a first growth speed in the first growth process to a second growth speed in the second growth process.

As described above, since the flux of second growth source is increased in the third growth process, so that the third semiconductor layer 140 is formed at a high speed. Accordingly, the delay loss in the process time of the first semiconductor layer 120 grown at a low speed can be compensated.

According to the first embodiment, when the epitaxial layers are grown, that is, the first to third semiconductor layers 120, 130, and 140 are grown, the growth conditions, such as a temperature, a pressure, and the rotational speed of the substrate, of the first to third semiconductor layers 120, 130, and 140 may be the same or different from each other. For example, the growth temperature, the pressure, and the rotational speed of the substrate may be set to values in the range of about 1600° C. to about 1650° C., the range of about 70 mbar to 120 mbar, and the range of about 50 rpm to 70 rpm, but the embodiment is not limited thereto.

Figure 5:
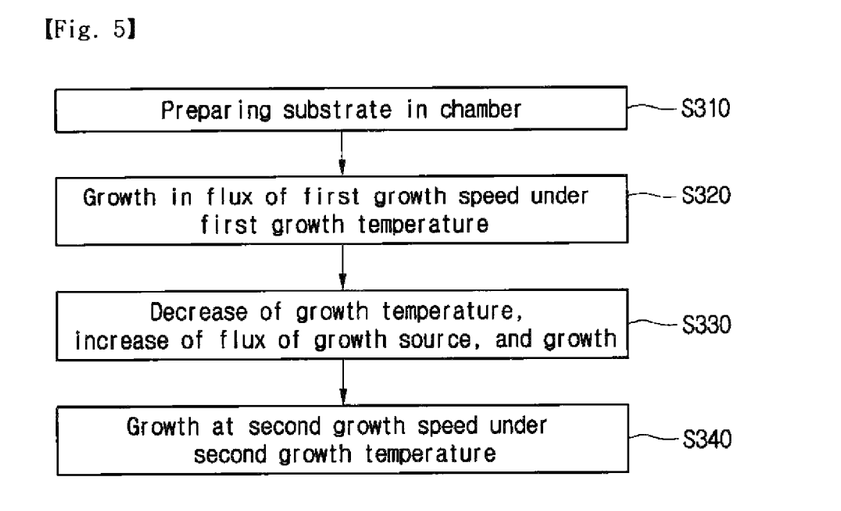
FIG. 5 is a flowchart showing the fabricating, process of the epitaxial wafer of FIG. 1 according to a second embodiment.

FIG. 5 is a flowchart showing the fabricating process of the epitaxial wafer of FIG. 1 according to a second embodiment.

In the following description of the second embodiment, the structure or functions the same as those of the first embodiment have been described above, and the details thereof will be omitted. Those skilled in the art can easily understand the same structure of functions as those of the first embodiment by making reference to the description of the first embodiment.

Referring to FIG. 5, the substrate 110 may be provided in the reaction chamber (S310).

The substrate 110 may include one of 3C—SiC, 4H—SiC and 6H—SiC.

When the substrate 110 is provided, the reaction source may be introduced for the epitaxial growth in the reaction chamber.

The reaction source may include growth source for the epitaxial growth, doping source for doping, and dilution gas, but the embodiment is not limited thereto.

The epitaxial growth is performed on the substrate 110 through the first growth process, so that the first semiconductor layer 120 may be formed (S320).

In the first growth process, the growth temperature (first growth temperature) may be in the range of 1510° C. to 1800° C., the C/Si ratio may be in the range of about 0.7 to 0.8, the $Si/H_2$ ratio is 1/3000 or less, and the injection parameter of the reaction source may be adjusted to the value in the range of 1.5 ml/min to 40 ml/min.

As described above, the flux of the growth source, that is, the ratio of $Si/H_2$ represents a smaller value, the first growth speed of 1 μm/h to 3 μm/h lower than that of the first growth process can be obtained.

According to the second embodiment, the growth temperature is highly set, so that the mobility between atoms of the reaction source is increased. Accordingly, the environment allowing the uniform growth is provided, and the flux of the growth source is reduced, so that the growth speed is lowered. Accordingly, the time that the atoms are uniformly distributed and grown on the substrate 110 may be increased. Therefore, the first semiconductor layer 120 grown through the first growth process can minimize the lattice mismatch from the substrate 110, so that the surface defect can be significantly reduced.

The thickness of the first semiconductor layer 120 grown through the first growth process may be in the range of about 0.5 μm to 1 μm, but the embodiment is not limited thereto.

The doping concentration of the first semiconductor layer 120 grown through the first growth process may be in the range of about $5 \times 10^{17}/cm^3$ to $7 \times 10^{18}/cm^3$. As described above, the doping concentration of the first semiconductor layer 120 making contact with the substrate 110 is increased, thereby preventing the defect caused by the lattice mismatch from the substrate 110.

The second growth process is performed subsequently to the first growth process to form the second semiconductor layer 130. In other words, according to the second growth process, the reaction source is continuously introduced into the reaction chamber, the growth temperature is slowly decreased, and the flux of the growth source is gradually increased to perform an epitaxial growth, so that the second semiconductor layer 130 can be formed (S330).

Figure 6:
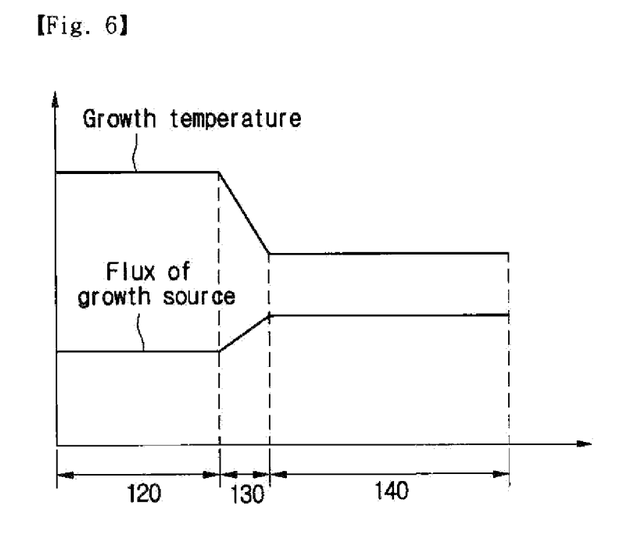
FIG. 6 is a graph showing a flux of a growth source and the variation of a growth temperature according to the epitaxial growth.

As shown in FIG. 6, the growth temperature in the second growth process may be decreased from the first growth temperature in the first growth process to the second growth temperature in the third growth process to be described later. The second growth temperature may be in the range of about $5 \times 10^{17}/cm^3$ to about $7 \times 10^{18}/cm^3$. The growth temperature in the second growth process may be decreased linearly, non-linearly, or step by step.

On the contrary, the flux of the growth source in the second process may be increased from the flux of the growth source in the first growth process to the flux of the growth source in the third growth process.

The growth source in the second growth process may be increased linearly, non-linearly, or step by step.

The second growth process is an intermediate process for the setting of the third growth process, and a step in which the growth temperature and the flux of the growth source are changed. The second semiconductor layer 130 may be grown through the second growth process.

If the flux of the growth, source is not introduced into the reaction chamber until the growth temperature in the second growth process is decreased from the first growth temperature in the first growth process to the third growth temperature in the third growth process, the epitaxial growth is not performed any more Thereafter, when the third growth process is performed, the third semiconductor layer 140 may be not easily grown on the first semiconductor layer 120 due to the rapid change of the environment, and the internal defects, the surface defects, and the surface roughness of the third semiconductor layer 140 may be increased.

According to the second embodiment, the epitaxial growth is not stopped, but continued by the second growth process, so that the third semiconductor layer 140 can be easily grown, and the internal defects, the surface defects, and the surface roughness of the third semiconductor layer 140 may be decreased.

In the second growth process, the flux of the doping source in the reaction source may be set to be increased to the flux of the doping source satisfying the doping concentration of the third semiconductor layer 140 from the flux of the doping source satisfying the doping concentration of the first semiconductor layer 120. Accordingly, the flux of the doing source introduced into the reaction chamber in the second growth process may be set to be increased together with the flux of the growth source. For example, the flux of the doping source introduced into the reaction chamber during the second growth process may be set to be increased from a value in the range of 0.1 ml/min to 0.5 ml/min to a value in the range of 1.5 ml/min to 2.5 ml/min linearly, non-linearly, or step by step.

Accordingly, the difference in doping concentration between the first and second semiconductor layers 120 and 140 can be adjusted due to the second semiconductor layer 130. Accordingly, the doping concentration of the second semiconductor layer 130 on the boundary surface A between the first semiconductor layer 120 and the second semiconductor layer 130 may be different from the doping concentration of the second semiconductor layer 130 on the boundary surface B between the second semiconductor layer 130 and the third semiconductor layer 140. In order to obtain the doping concentration of the second semiconductor layer 130, the flux of the doping source in the second growth process may be reduced from the flux of the doping source in the first growth process to the flux of the doping source in the second growth process. Accordingly, the doping concentration of the second semiconductor layer 130 may be reduced from $5 \times 10^{16}/cm^3$ to $1 \times 10^{16}/cm^3$ to $1 \times 10^{16}/cm^3$ to $5 \times 10^{14}/cm^3$.

The second growth process may be continuously performed until the growth temperature and the growth speed satisfy the condition in the growth process of the third semiconductor layer 140. The second semiconductor layer 130 distinguished from the first and second semiconductor layers 120 and 140 may be formed through the second growth process.

If the growth temperature and the flux of the growth source for the third semiconductor layer 140 are satisfied, the third growth process may be performed subsequently to the second growth process. In other words, in the third growth process, the flux of the growth source more than the flux of the growth source in the first growth process and the reaction source are continuously introduced and the epitaxial growth is performed until the target thickness is achieved at the second growth temperature lower than the first growth temperature in the first growth process, thereby forming the third semiconductor layer 140 (S340).

The second growth temperature may be in the range of about 1500° C. to about 1700° C. The doping concentration of the third semiconductor layer 140 grown under the growth condition may be in the range of about $1 \times 10^{15}/cm^3$ to $5 \times 10^{15}/cm^3$.

The growth speed may be controlled according to the flux of the growth source in the reaction source.

The second growth speed according to the growth source increased as described above is about 20 µm/h or more which is higher than the value in the range of 1 µm/h to 3 µm/h according to the flux of the growth source in the first growth process.

As described above, the growth process for the growth of the third semiconductor layer 140, so that the growth delay of the first and second semiconductor layers 120 and 130 may be compensated.

According to the second embodiment, a less flux of the growth source is introduced in the first growth process for forming the first semiconductor layer 120 to maintain the growth process at a low speed, so that atoms are uniformly distributed on the substrate 110, thereby reducing defects. In addition, a greater flux of the growth source is introduced in the third growth process for forming the third semiconductor layer 140 to maintain the growth process at a high speed, so that the third semiconductor layer 140 can be rapidly grown to the target thickness, thereby reducing the process time.

In order to prevent the third semiconductor layer 140 from being grown under the rapidly changed process condition, the second growth process is performed to naturally change the process condition of the first growth process for forming the first semiconductor layer 120 into the process condition of the third growth process for forming the third semiconductor layer 140, and the second semiconductor layer 130 may be grown through the second growth process.

The densities of the growth sources for the first to third semiconductor layers 120, 130, and 140 formed through the first to third growth processes may be varied. In other words, the densities of the growth sources included in the first to third semiconductor layers 120, 130, and 140 may be varied by changing the fluxes of the growth sources introduced in order to form the first to third semiconductor layers 120, 130, and 140. The growth source may include silicon.

For example, the flux of the growth source in the first growth process may be greater than the flux of the growth source in the third growth process, and greater than the flux of the growth source in the second growth process. The density of the growth source of the third semiconductor layer 140 may be grater than the density of the growth source of the first semiconductor layer 120. In addition, the density of the growth source of the second semiconductor layer 130 may be increased linearly, non-linearly, or step by step.

An epitaxial layer including the first to third semiconductor layers 120, 130, and 140 may be formed on the substrate 110 through the above fabricating process. In this case, the surface roughness of the uppermost layer of the epitaxial layer, that is, the surface roughness of the third semiconductor layer 140 may be about 1 nm or less, and the surface defect density of the third semiconductor layer may be about $0.1/cm^2$ or less.

The epitaxial wafer may be applied to various electronic elements.

An epitaxial wafer 100 fabricated as described above may be applied to various electronic elements. The electronic elements may include a semiconductor switching element or a light-emitting element, but the embodiment is not limited thereto. The semiconductor switching element may include power elements such as, a Schottky Barrier Diode and a MESFET.

Figure 7:
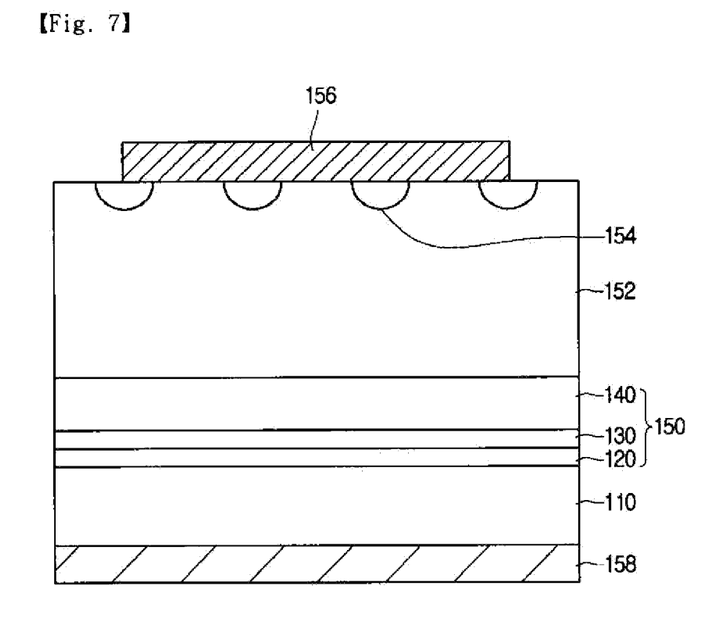
FIG. 7 is a sectional view showing a schottky barrier diode according to the embodiment.

FIG. 7 is a sectional view showing a Schottky barrier diode according to an embodiment.

Referring to FIG. 7, the Schottky barrier diode according to the embodiment may include the substrate 110, the epitaxial layer 150, a drift layer 152, a plurality of doping regions 154, an anode contact 156 and a cathode contact 158.

The substrate 110 and the epitaxial layer 120 constitute the epitaxial wafer 100 according to the first, second and third embodiments.

As described above, the epitaxial layer 150 of the epitaxial wafer 100 according to the first, second and third embodiments includes the epitaxial layer 150 including the first semiconductor layer 130 that is grown at the low growth speed and the third semiconductor layer 140 that is grown at the high growth speed, thereby minimizing the internal defect and the surface defect. In addition, the second semiconductor layer 130 may be formed in order to maintain the continuity in the growth of the first and third semiconductor layers 120 and 140.

For example, the substrate 110 and the epitaxial layer 150 may constitute an N type conductive layer, but the embodiment is not limited thereto.

The drift layer 152 may be formed on the epitaxial layer 150. The drift layer 152 may include silicon carbide and may include the N type conductive layer, but the embodiment is not limited thereto.

The doping regions 154, for example, may be formed on a top surface of the drift layer 152 through ion implantation.

The anode contact 156 may make contact with both of the drift layer 152 and the doping region 154 and may be formed on the drift layer 152. The anode contact 156 may form a Schottky junction with the top surface of the drift layer 152 formed between the doping regions 154, and may make ohmic-contact with the doping region 154.

The cathode contact 158 may be formed on a bottom surface of the substrate 110. The anode electrode 156 and the cathode electrode 158 may include metal, but the embodiment is not limited thereto.

When operating in a forward direction, the junction between the anode contact 156 and the drift layer 152 may be turned on at a voltage lower than that of the junction between the doping region 154 and the drift layer 152. Therefore, the element shows a Schottky diode behavior at a lower forward voltage. In other words, the movement of the current in the element may depend on a plurality of carriers injected throughout the whole region of the Schottky junction in the low forward direction voltage. At general voltage, minority carriers are not injected into the element, so the Schottky barrier diode may have a rapid switching speed characteristic of a Schottky diode.

Under a reverse bias condition, a depletion region formed by the PN junction between the doping region 154 and the drift layer 152 is expanded to block a reverse direction current through the element such that the Schottky junction may be protected and the reverse direction leakage current in the element may be limited.

Meanwhile, the first and second semiconductor layers 120 and 130 may serve as the buffer layers, and the third semiconductor layer 140 may serve as the drift layer, but the embodiment is not limited thereto.

When the third semiconductor layer 140 serves as the drift layer, the drift layer 152 is not required to be formed. In other words, the doping region 154 may be directly formed on the top surface of the second semiconductor layer 140.

Figure 8:
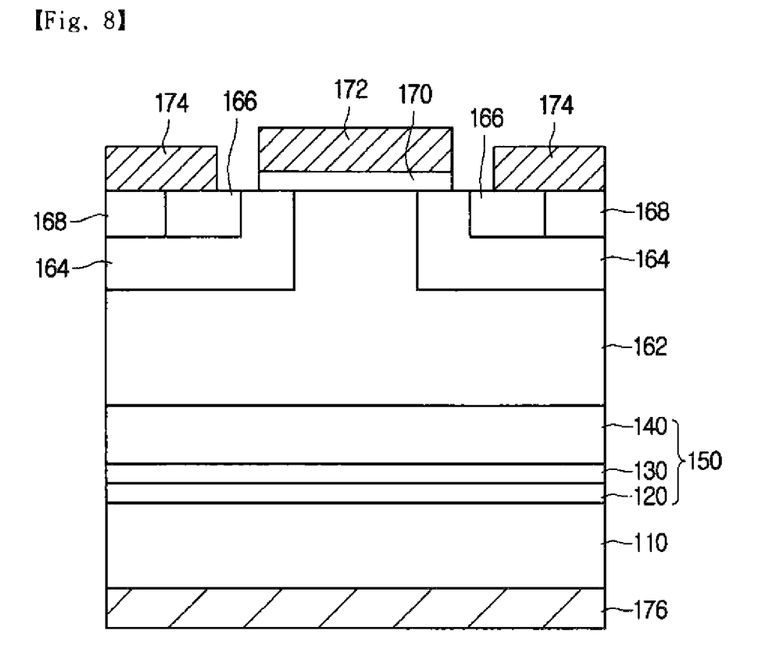
FIG. 8 is a sectional view showing a MESFET according to the embodiment.

FIG. 8 is a sectional view showing a MESFET according to the embodiment.

Referring to FIG. 8, the MSFET according to the embodiment may include the substrate 110, the epitaxial layer 150, a drift region 162, a body region 164, a source region 166, a body contact region 168, a gate insulator 170, a gate contact 172, a source contact 174, and a drain contact 176.

The substrate 110 and the epitaxial layer 150 constitute the epitaxial wafer 100 according to the first and second embodiments. Accordingly, the details of the epitaxial wafer 100 will be omitted below.

The substrate 110 and the epitaxial layer 150 may be N type conductive layers, but the embodiment is not limited thereto.

The drift layer 162 may be formed on the epitaxial layer 150. The drift layer 162 may include silicon carbide, and may be an N type conductive layer, but the embodiment is not limited thereto.

The body region 164 may be formed on the drift layer 162 through ion implantation. The body region 164 may be a P type doping region, but the embodiment is not limited thereto.

The source region 166 may be formed in the body region 164 adjacent to the contact region 168. The source region 166 may be an N type doping region, and the body contact region 168 may be a P+ doping region, but the embodiment is not limited thereto.

The gate insulator 170 may be formed on a top surface of the drift layer 162 and may extend to a top surface of the body region 164 between the source region 166 and the drift region 162.

The gate contact 172 may be formed on the gate insulator 170, the source contact 174 may be formed on the source region 166, and the drain contact 176 may be formed on a bottom surface of the substrate 110.

If voltage is sufficiently applied to the gate contact 172, a channel is induced to the surface of an element in the body region 164 between the source region 166 and the drift layer 162, so that the element may be turned on.

When the element is turned off, that is, there is no gate voltage sufficient to induce the channel, a MESFET structure may be the same as that of a PN diode including the body region 164, the drift layer 162, and the substrate 110. When the MESFET structure is biased in the reverse direction, the depletion region may be expanded toward the substrate 110 on the surface of the drift layer 162 in the junction between the body region 164 and the drift layer 162, which blocks the drain voltage.

Meanwhile, the first and second semiconductor layers 120 and 130 serve as buffer layers, and the third semiconductor layer 140 may serve as a drift layer, but the embodiment is not limited thereto.

When the third semiconductor layer 140 serves as a drift layer, the drift layer 162 may not be formed. In other words, the body region 164, the source region 166, and the body contact region 168 may be directly formed on the top surface of the third semiconductor layer 140.

Figure 9:
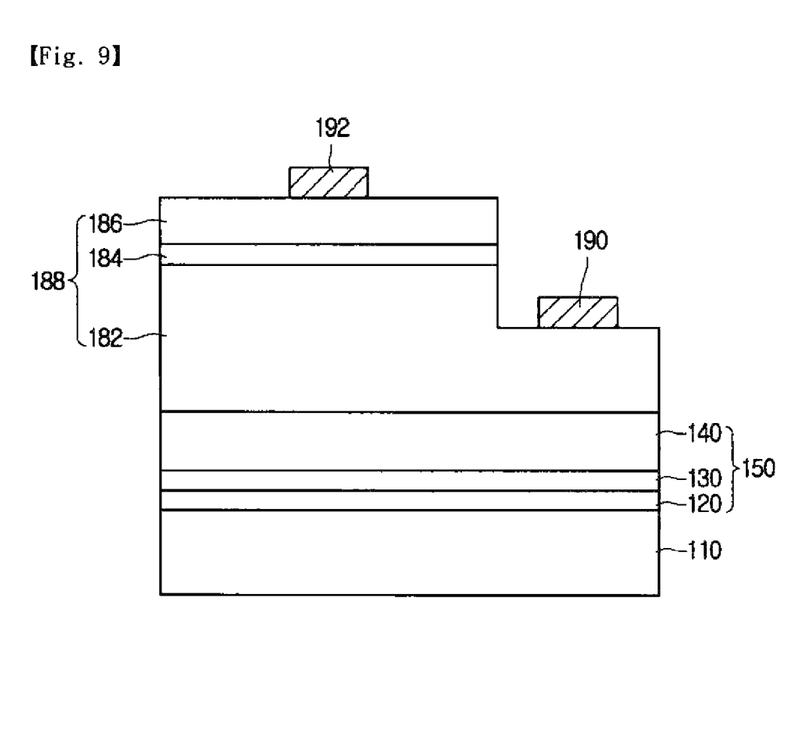
FIG. 9 is a sectional view showing a light-emitting element according to the embodiment.

FIG. 9 is a sectional view showing the light-emitting element according to the embodiment.

Referring to FIG. 9, the light-emitting element according to the embodiment may include the substrate 110, the epitaxial layer 150, a light emitting structure 188, and first and second electrodes 190 and 192.

The substrate 110 and the epitaxial layer 150 constitute the epitaxial wafer 100 according to the first and third embodiments. Accordingly, the details of the epitaxial wafer 100 will be omitted below.

The substrate 110 may not contain dopants.

The epitaxial layer 150 may be an N type conductive layer, but the embodiment is not limited thereto. In addition, although the first to third semiconductor layers 120, 130, and 140 include N type dopants in the epitaxial process, the embodiment is not limited thereto.

The light emitting structure 188 may generate light. The light emitting structure 188 may include a group III-V compound semiconductor material.

The light emitting structure 188 may include a first conductive semiconductor layer 182, an active layer 184, and a second conductive semiconductor layer 186.

For example, the first and second conductive semiconductor layers 181 and 186 may include one of GaN, AlGaN and AlInGaN.

For example, the first conductive semiconductor layer 182 may include an N type dopant, and the second conductive semiconductor layer 186 may include a P type dopant, but the embodiment is not limited thereto.

The active layer 184 may generate light having a wavelength corresponding to energy bandgap determined by a compound semiconductor material of the active layer 184 by recombining a first carrier, for example, an electron supplied from the first conductive semiconductor layer 182 with a second carrier, for example, a hole supplied from the second conductive semiconductor layer 186.

The active layer 184 may have a lamination structure formed by repeating one cycle including a well layer and a barrier layer several times.

The first electrode 190 may be provided on a portion of the first conductive semiconductor layer 182, and the second electrode 192 may be provided on a portion of the second conductive semiconductor layer 186.

The size of the second electrode 192 may correspond to the portion of the second conductive semiconductor layer 186, so that current can be mainly concentrated onto the portion of the second conductive semiconductor layer 186 corresponding to the size of the second electrode 192. In order to solve the above problem, a transparent conductive layer, for example, including ITO may be provided on an entire portion of the second conductive semiconductor layer 186. Accordingly, since current supplied from the second electrode 192 is spread due to the transparent conductive layer, the current is uniformly applied to the entire portion of the second conductive semiconductor layer 86, so that light can be uniformly generated.

The first and second electrodes 190 and 192 may include metal.

When power is supplied to the first and second electrodes 190 and 192, electrons are generated from the first conductive semiconductor layer 182, holes are generated from the second conductive semiconductor layer 186, and electrons and holes are recombined with each other in the active layer 184 to generate light.

Lights having various wavelengths may be generated depending on energy bandgaps of the active layer 184.

Therefore, the light-emitting element according to the embodiment may include a red light-emitting element, a green light-emitting element, a blue light-emitting element, an infrared light-emitting element, or an ultraviolet light-emitting element.

The light-emitting element according to the embodiment is packaged so that the light-emitting element may be applied to lighting, a display, or a backlight unit.

As described above, semiconductor electronic elements, such as a Schottky barrier diode, a MESFET, and a light-emitting element, can be fabricated using the epitaxial wafer 100 according to the first to third embodiments.

INDUSTRIAL APPLICABILITY

The epitaxial wafer according to the embodiment is applicable for an electronic element. The electronic element may be a switch element or a light-emitting element. For example, the switch element may be a Schottky barrier diode or a MESFET.

The invention claimed is:

1. An epitaxial wafer comprising:
a substrate; and
an epitaxial layer on the substrate,
wherein the epitaxial layer comprises:
a first semiconductor layer disposed on the substrate and having a first doping concentration;
a second semiconductor layer disposed on the first semiconductor layer, having a thickness thinner than a thickness of the first semiconductor layer, and having a second doping concentration; and
a third semiconductor layer disposed on the second semiconductor layer, having a thickness thicker than the thickness of the first semiconductor layer, and having a third doping concentration,
wherein the first doping concentration is in a range of $5 \times 10^{17}/cm^3$ to $5 \times 10^{18}/cm^3$,
wherein the third doping concentration is in a range of $2 \times 10^{15}/cm^3$ to $7 \times 10^{15}/cm^3$,
wherein the second doping concentration is between the first doping concentration and the third doping concentration,
wherein the second doping concentration is varied in a thickness direction of the second semiconductor layer, and
wherein the second doping concentration becomes gradually lower from the first semiconductor layer to the third semiconductor layer.

2. The epitaxial wafer of claim 1, wherein the second doping concentration in a first region of the second semiconductor layer making contact with the first semiconductor layer is lower than the first doping concentration.

3. The epitaxial wafer of claim 1, wherein the second doping concentration in a second region of the second semiconductor layer making contact with the third semiconductor layer is higher than the third doping concentration.

4. The epitaxial wafer of claim 1, wherein the first semiconductor layer and the second semiconductor layer constitute a buffer layer.

5. The epitaxial wafer of claim 1, wherein the first semiconductor layer includes a compound semiconductor material.

6. The epitaxial wafer of claim 1, wherein the third semiconductor layer has a surface roughness of 1 nm or less.

7. The epitaxial wafer of claim 1, wherein the third semiconductor layer has a surface defect density of $0.1/cm^2$ or less.

8. The epitaxial wafer of claim 1, wherein the substrate comprises one of 3C—SiC, 4H—SiC, and 6H—SiC.

9. The epitaxial wafer of claim 1, wherein at least one of the first to third semiconductor layers comprises a silicon carbide nitride (SiCN) semiconductor layer.

10. The epitaxial wafer of claim 1, wherein at least one of the first to third semiconductor layers comprises an aluminum silicon carbide (AlSiC) semiconductor layer.

11. The epitaxial wafer of claim 1, wherein the epitaxial layer comprises a same material as a material of the substrate.

12. A switch element comprising:
a substrate;
a first semiconductor layer on the substrate;
a second semiconductor layer on the first semiconductor layer;
a third semiconductor layer on the second semiconductor layer;
an anode electrode on the third semiconductor layer; and
a cathode electrode under the substrate,
wherein the second semiconductor layer has a thickness thinner than a thickness of the first semiconductor layer, and
wherein the third semiconductor layer has a thickness thicker than the thickness of the first semiconductor layer,
wherein a first doping concentration of the first semiconductor layer is in a range of $5 \times 10^{17}/cm^3$ to $5 \times 10^{18}/cm^3$,
wherein a third doping concentration of the third semiconductor layer is in a range of $2 \times 10^{15}/cm^3$ to $7 \times 10^5/cm^3$,
wherein a second doping concentration of the second semiconductor layer is between the first doping, concentration of the first semiconductor layer and the third doping concentration of the third semiconductor layer,
wherein the second doping concentration of the second semiconductor is varied in a thickness direction of the second semiconductor layer, and
wherein the second doping concentration of the second semiconductor layer becomes gradually lower from the first semiconductor layer to the third semiconductor layer.

13. A light emitting element comprising:
a substrate;
an epitaxial layer on the substrate; and
a light emitting structure disposed on the epitaxial layer and comprising at least a first conductive semiconductor layer, an active layer, and a second conductive semiconductor layer,
wherein the epitaxial layer comprises:
a first semiconductor layer on the substrate;
a second semiconductor layer on the first semiconductor layer; and
a third semiconductor layer on the second semiconductor layer,
wherein the second semiconductor layer has a thickness thinner than a thickness of the first semiconductor layer,
wherein the third semiconductor layer has a thickness thicker than the thickness of the first semiconductor layer,
wherein a first doping concentration of the first semiconductor layer is in a range of $5 \times 10^{17}/cm^3$ to $5 \times 10^{18}/cm^3$,
wherein a third doping concentration of the third semiconductor layer is in a range of $2 \times 10^{15}/cm^3$ to $7 \times 10^{15}/cm^3$,
wherein a second doping concentration of the second semiconductor layer is between the first doping concentration of the first semiconductor layer and the third doping concentration of the third semiconductor layer,
wherein the second doping concentration of the second semiconductor is varied in a thickness direction of the second semiconductor layer, and
wherein the second doping concentration of the second semiconductor layer becomes gradually lower from the first semiconductor layer to the third semiconductor layer.

* * * * *